(12) United States Patent
Hsu

(10) Patent No.: US 10,163,509 B2
(45) Date of Patent: *Dec. 25, 2018

(54) METHOD AND APPARATUS FOR STORING INFORMATION USING A MEMORY ABLE TO PERFORM BOTH NVM AND DRAM FUNCTIONS

(71) Applicant: NEO Semiconductor, Inc., San Jose, CA (US)

(72) Inventor: Fu-Chang Hsu, San Jose, CA (US)

(73) Assignee: NEO Semiconductor, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/687,405

(22) Filed: Aug. 25, 2017

(65) Prior Publication Data

US 2017/0352419 A1   Dec. 7, 2017

Related U.S. Application Data

(60) Division of application No. 14/864,741, filed on Sep. 24, 2015, now Pat. No. 9,761,310, which is a
(Continued)

(51) Int. Cl.
*G11C 14/00* (2006.01)
*G11C 16/08* (2006.01)
(Continued)

(52) U.S. Cl.
CPC ...... *G11C 14/0018* (2013.01); *G11C 11/4096* (2013.01); *G11C 16/0483* (2013.01);
(Continued)

(58) Field of Classification Search
CPC ............ G11C 14/0018; G11C 11/4096; G11C 16/0483; G11C 16/08; G11C 16/10; G11C 16/26

See application file for complete search history.

(56) References Cited

U.S. PATENT DOCUMENTS 5,305,283 A  4/1994  Shimokura et al.
6,064,622 A  5/2000  Lee et al.
(Continued)

FOREIGN PATENT DOCUMENTS

TW    I 415138 B    11/2013
TW    201419301 A    5/2014

OTHER PUBLICATIONS

International Search Report, dated Feb. 2, 2016, for corresponding International Application No. PCT/US2015/052056.
(Continued)

*Primary Examiner* — Pho M Luu
(74) *Attorney, Agent, or Firm* — Intellectual Property Law Group LLP

(57) ABSTRACT

A memory device is able to store data using both on-chip dynamic random-access memory ("DRAM") and nonvolatile memory ("NVM"). The memory device, in one aspect, includes NVM cells, word lines ("WLs"), a cell channel, and a DRAM mode select. The NVM cells are capable of retaining information persistently and the WLs are configured to select one of the NVM cells to be accessed. The cell channel, in one embodiment, is configured to interconnect the NVM cells to form a NVM string. The DRAM mode select can temporarily store data in the cell channel when the DRAM mode select is active.

20 Claims, 13 Drawing Sheets

Related U.S. Application Data continuation-in-part of application No. 14/846,673, filed on Sep. 4, 2015.

(60) Provisional application No. 62/054,391, filed on Sep. 24, 2014, provisional application No. 62/046,902, filed on Sep. 6, 2014.

(51) Int. Cl.
  *G11C 16/04* (2006.01)
  *G11C 16/26* (2006.01)
  *G11C 11/4096* (2006.01)
  *G11C 16/10* (2006.01)
  *G11C 7/10* (2006.01)

(52) U.S. Cl.
  CPC .............. *G11C 16/08* (2013.01); *G11C 16/10* (2013.01); *G11C 16/26* (2013.01); *G11C 7/1039* (2013.01)

(56) References Cited

U.S. PATENT DOCUMENTS

| | | | |
|---|---|---|---|
| 6,175,523 B1 | 1/2001 | Yang et al. | |
| 6,687,158 B2 | 2/2004 | Yano | |
| 6,847,555 B2 | 1/2005 | Toda | |
| 6,996,007 B2 | 2/2006 | Ahn et al. | |
| 7,110,301 B2 | 9/2006 | Lee et al. | |
| 7,257,027 B2 | 8/2007 | Park | |
| 7,359,248 B2 | 4/2008 | Chen et al. | |
| 7,489,546 B2 | 2/2009 | Roohparvar | |
| 8,089,815 B2 | 1/2012 | Li et al. | |
| 8,310,872 B2 | 11/2012 | Koya et al. | |
| 8,331,146 B2 | 12/2012 | Fukuda | |
| 8,824,221 B2 * | 9/2014 | Cho ........................ | G11C 7/10 365/189.2 |
| 9,076,512 B2 * | 7/2015 | Kim ........................ | G11C 8/18 |
| 9,761,310 B2 * | 9/2017 | Hsu ........................ | G11C 14/0018 |
| 2005/0204091 A1 | 9/2005 | Kilbuck et al. | |
| 2010/0302849 A1 | 12/2010 | Jung et al. | |
| 2011/0302367 A1 | 12/2011 | Balkesen et al. | |
| 2012/0039130 A1 | 2/2012 | Yoon et al. | |
| 2012/0040504 A1 | 2/2012 | Lin et al. | |
| 2013/0272066 A1 | 10/2013 | Liu | |
| 2013/0329491 A1 * | 12/2013 | Chang ..................... | G11C 5/04 365/185.03 |
| 2014/0040571 A1 | 2/2014 | Pilolli et al. | |

OTHER PUBLICATIONS

Written Opinion of the International Searching Authority, dated Feb. 2016, for corresponding International Application No. PCT/US2015/050056.

* cited by examiner

|  |  | DSG | WLselect | WLunselect | SSG | BL | SL | TPW |
|---|---|---|---|---|---|---|---|---|
| NVM mode | Erase | FL | 0V | FL | FL | FL | FL | VPP |
| | Program | Vdd | VPP | Vmp | 0V | 0V/Vdd | Vdd | 0V |
| | Read | Vdd | Vread | Vpass | Vdd | Vdd | 0V | 0V |
| DRAM mode | Read/Write | Vdd/0V | Vcp | Vcp | 0V |  | 0V | 0V |

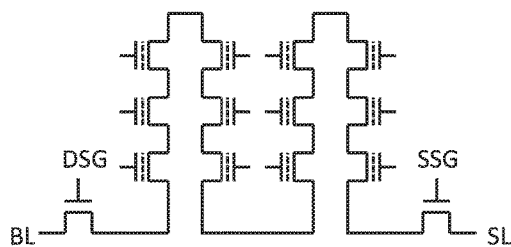
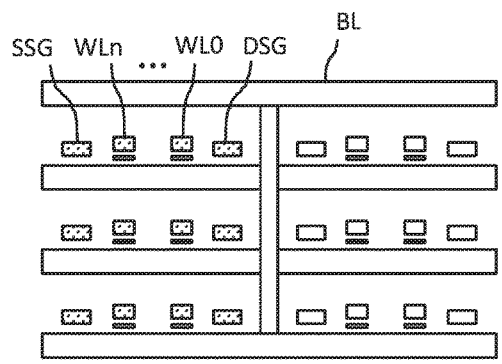
FIG.17C          FIG.17D
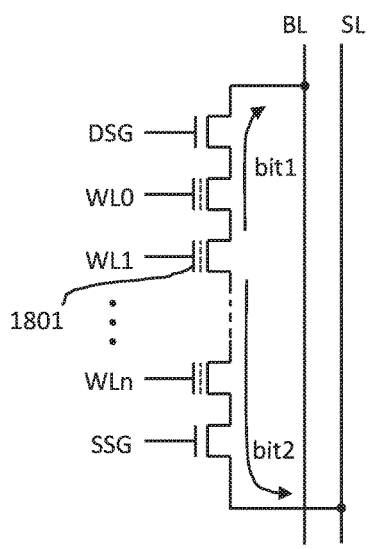
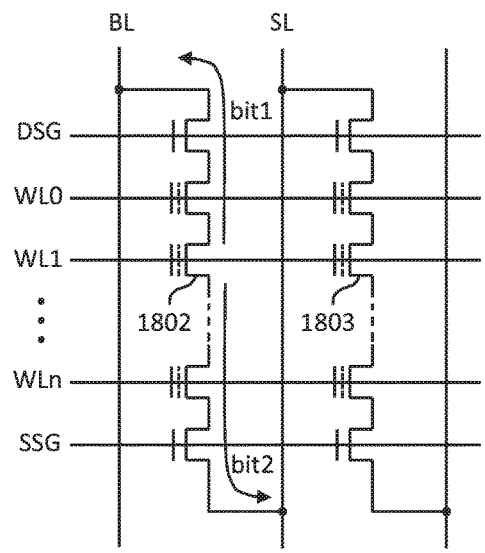
FIG.18A          FIG.18B

METHOD AND APPARATUS FOR STORING INFORMATION USING A MEMORY ABLE TO PERFORM BOTH NVM AND DRAM FUNCTIONS

CROSS-REFERENCE TO RELATED APPLICATIONS

This application is a divisional of commonly owned U.S. patent application Ser. No. 14/864,741 filed on Sep. 24, 2015, which has been issued into U.S. Pat. No. 9,761,310, which claims the benefit of priority based upon U.S. Provisional Patent Application Ser. No. 62/054,391, filed on Sep. 24, 2014 and entitled "D-NAND: Novel Memory Cell and Array Combining DRAM and NAND," and which is a continuation-in-part (CIP) application of co-pending U.S. patent application Ser. No. 14/846,673, entitled "Method and Apparatus for Writing Nonvolatile Memory Using Multiple-Page Programming," filed on Sep. 4, 2015, all of which are hereby incorporated herein by reference in their entireties.

FIELD OF THE INVENTION

The exemplary embodiment(s) of the present invention relates to the field of semiconductor and integrated circuits. More specifically, the exemplary embodiment(s) of the present invention relates to memory and storage devices.

BACKGROUND OF THE INVENTION

A digital processing system typically contains a memory device for data storage. The memory device, for example, is generally categorized volatile memory and/or nonvolatile memory device. Volatile memory includes random-access memory ("RAM"), static random-access memory ("SRAM"), and/or dynamic random-access memory. Nonvolatile memory ("NVM") can be NAND flash memory, NOR flash memory, phase-changing memory, Electrically Erasable Programmable Read-Only Memory ("EEPROM"), and Silicon-Oxide-Nitride-Oxide-Silicon ("SONOS") memory, and the like.

NVM, such as NAND or NOR based flash memory, is widely used in today's computing world, and its unique cell structure provides a small, high density, and low write current storage device. NVM such as NAND based flash memory has become a major persistent storage memory for various devices and systems, such as memory cards, USB flash drives, and solid-state drives. Some exemplary applications of flash memory include personal computers, PDAs, digital audio players, digital cameras, mobile phones, synthesizers, video games, scientific instrumentation, industrial robotics, and medical electronics. With technologic improvement, the NVM technology such as NAND flash memory has reached 16 nanometers ("nm"), and its single-chip density can reach 128 gigabit ("Gb") storage capacity. A drawback associated with NAND flash memory, however, is slow read and/or write operation. For example, a typical read operation may take 25 nanoseconds ("µs") and an erase operation can take two (2) milliseconds ("ms"). A page write operation can take up to 300 µs to complete. The slow operation can negatively impact the overall system performance.

DRAM typically provides relatively fast read and/or write operation. However, DRAM is a volatile memory wherein the stored data may disappear when the power is down. Also, DRAM cell size is typically larger than NAND cell size whereby it generally has higher cost and lower density. For a typical computing system, NVM such as NAND based flash memory is used for main storage while DRAM is used for working memory. For example, data stored in NVM can be loaded into DRAM for processing and executing, and the result may be subsequently written back to NVM when the task is done.

Since the density of DRAM is generally lower than the density of NVM such as NAND flash memory, NAND and DRAM are generally fabricated in separate chips or dies due to different processes. However, two-chip solution not only increases the chip count, footprint, system cost, but also slows down the system performance due to data transfer between the two chips.

SUMMARY

One embodiment of the present invention discloses a memory device able to store data using both on-chip dynamic random-access memory ("DRAM") and nonvolatile memory ("NVM"). The memory device, in one aspect, includes NVM cells, word lines ("WLs"), a cell channel, and a DRAM mode select. The NVM cells are capable of retaining information persistently and the WLs are configured to select one of the NVM cells to be accessed. The cell channel, in one embodiment, is configured to interconnect the NVM cells to form a NVM string. The DRAM mode select can temporarily store data in the cell channel when the DRAM mode select is active.

Additional features and benefits of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

FIGS. 16A-B and 17A-D are diagrams illustrate two-dimensional ("2D") or three-dimensional ("3D") DNAND in accordance with one embodiment of the present invention;

FIGS. 18A-B and 19A-C are diagrams illustrating exemplary DNAND configurations with multiple NAND strings in accordance with one embodiment of the present invention.

DETAILED DESCRIPTION

Figure 1:
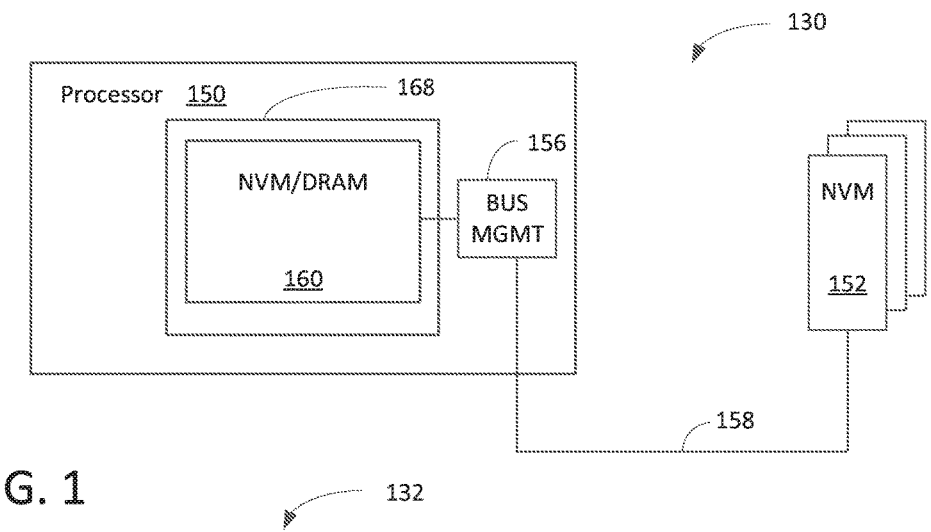
FIG. 1 is a block diagram illustrating a computing system having a memory device able to perform both NVM and DRAM functions in accordance with one embodiment of the present invention.

Exemplary embodiment(s) of the present invention is described herein in the context of a method, device, and apparatus for improving memory storage efficiency using on-chip nonvolatile memory ("NVM") and dynamic random-access memory ("DRAM").

Those of ordinary skilled in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

In accordance with the embodiment(s) of present invention, the components, process steps, and/or data structures described herein may be implemented using various types of operating systems, computing platforms, computer programs, and/or general purpose machines. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

Those of ordinary skills in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skills in the art. Such persons of ordinary skills in the art will now also realize that a range of doping concentrations around those described above will also work. Essentially, any process capable of forming pFETs and nFETs will work. Doped regions may be diffusions or they may be implanted.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processors and systems, control logic, ASICs, chips, workstations, mainframes, etc. The term "device" is used generically herein to describe any type of mechanism, including a computer or system or component thereof.

The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to the block and flow diagrams, are typically performed in a different serial or parallel ordering and/or by different components and/or over different connections in various embodiments in keeping within the scope and spirit of the invention.

One embodiment of the present invention discloses a memory device able to store data using both on-chip dynamic random-access memory ("DRAM") and nonvolatile memory ("NVM"). The memory device, in one aspect, includes NVM cells, word lines ("WLs"), a cell channel, and a DRAM mode select. The NVM cells are capable of retaining information persistently and the WLs are configured to select one of the NVM cells to be accessed. The cell channel, in one embodiment, is configured to interconnect the NVM cells to form a NVM string. The DRAM mode select can temporarily store data in the cell channel when the DRAM mode select is active.

FIG. 1 is a block diagram 130 illustrating a computing system having a memory device able to perform both NVM and DRAM functions in accordance with one embodiment of the present invention. Diagram 130, in one embodiment, includes a processor 150, NVM storage 152, and a bus 158. Processor 150 further includes an on-chip memory 168 and a bus manager 156 wherein on-chip memory 168 further includes a dual function storage 160 that is capable of performing DRAM and/or NVM based on mode selections. In one embodiment, NVM/DRAM 160 is coupled to NVM 162 for data storage as well as emergency backup. NVM, in one aspect, can be NAND based flash memory, NOR based flashed memory, phase-changing memory ("PCM"), EEPROM (erasable programmable read-only memory), or a combination of NAND, NOR, PCM, and/or EEPROM memory. To simplify forgoing discussion, NAND based flash memory is used as an exemplary NVM throughout the specification. It should be noted that the underlying concept of the exemplary embodiment(s) of the present invention would not change if one or more blocks (or devices) were added to or removed from diagram 130.

On-chip memory 168 containing NVM/DRAM 160 is referred to as DRAM-NAND ("DNAND") wherein DRAM cells and NAND cells are coupled with each other for enhancing memory performance. In one aspect, DNAND cell has NAND-like cell structure that is similar to NAND cell wherein the DNAND cell can be used as NAND cell and DRAM cell based on operation mode. For example, the DNAND cell has two operation modes wherein one mode is operating DNAND cell like a NAND flash cell while another mode is operating DNAND cell like a DRAM cell. In one embodiment, the DNAND cell provides read/write operation as read/write operation for DRAM. Alternatively, DNAND cells can also be organized in an array configuration which can be also used as DRAM array when DRAM operation mode is activated. Although memory block 168 is illustrated as an embedded memory within a central processing unit ("CPU"), memory block 168 can also be a stand-alone memory chip able to provide dual functions of NVM and DRAM.

Since DNAND uses similar NAND string(s) to provide both DRAM storage function as well as NAND flash memory function, DNAND, in one aspect, is able to place both DRAM cells and NAND cells on a single chip or die. To build or fabricate DRAM compatible to NAND process, both NAND and DRAM cells can be manufactured in one chip with the NAND process. NAND array and DRAM array may also be embedded in a microcontroller or any other chip(s).

Alternatively, the DNAND cell structure can also be implemented with SRAM process. For example, the DNAND cell can include NAND, DRAM, and SRAM in one chip with any of the standard NAND, DRAM, SRAM, or logic processes. Moreover, the DRAM, in one embodiment, can contain NVDRAM (non-volatile DRAM) function to store the entire DRAM array's data in one shot during the system power loss or power down. The data can be restored into the DRAM cells after the power is restored. Thus, the data can be ready for DRAM operations or written to NAND cells storage.

In operation, on-chip memory 168 is capable of facilitate data transfer between NVM/DRAM 160 and NVM 152 via bus 158. Bus manager 156 is capable of simultaneously transferring data between NVM/DRAM 160 of memory 168 and NVM 152. In another embodiment, on-chip memory 168 is able to backup data in NVM/DRAM 160 during an emergency shutdown or power loss. In one example, NVM/DRAM 160 allocates a portion of NVM cells for emergency backup purposes.

An advantage of employing on-chip memory 168 containing both DRAM and NVM is that it facilitates concurrent multiple-page NVM programming. In addition, on-chip memory 168 also improves overall data transfer speed between on-chip memory 168 and NVM 152 using NVM/DRAM 160. Furthermore, another advantage of using on-chip memory 168 is that it can backup data from DRAM to NVM cells during an emergency time.

Figure 2:
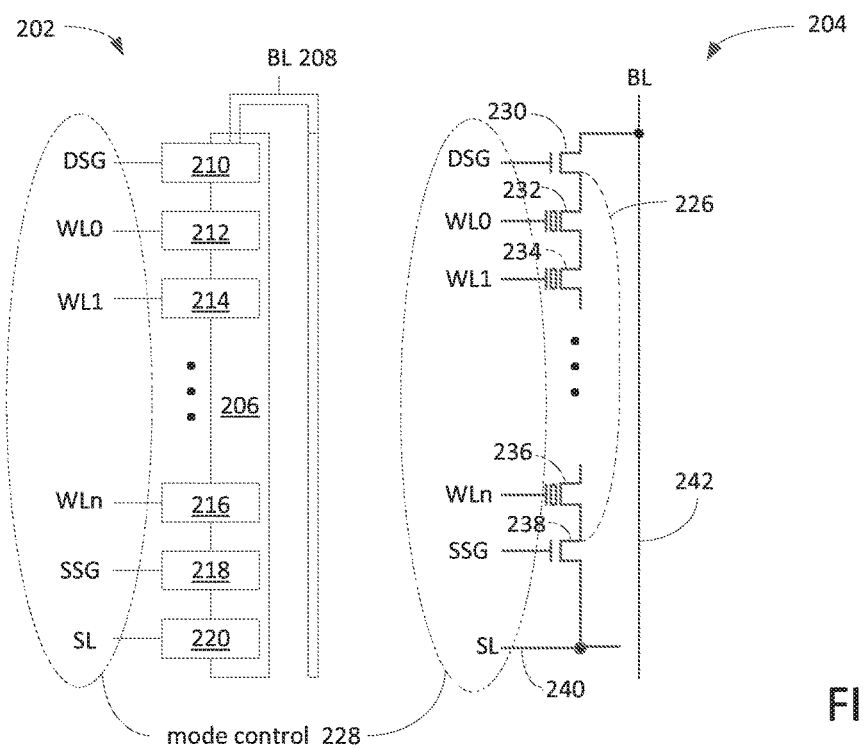
FIGS. 2-3 illustrate a memory device containing an NVM string able to perform a DRAM function in accordance with one embodiment of the present invention.

FIG. 2 illustrates a memory device containing an NVM string able to perform a DRAM function in accordance with one embodiment of the present invention. Diagram 202 is a logic layout illustrating a DNAND string capable of operating in a DRAM function as well as operating in a NAND NVM function. Diagram 204, which is similar to diagram 202, is a circuit diagram illustrating a DNAND string capable of performing DRAM or NAND function.

Diagram 202 includes a BL 208, DSG 210, SSG 218, NAND cells 212-216, source line ("SL") 220, and a cell channel 206. Cell channel 206, in one embodiment, is used to connect NAND cells 212-216 in a series forming a string. NAND cells 212-216 are coupled to WL0-WLn for selecting which NAND cell should be accessed. In one embodiment, cell channel 206 is able to temporally store a charge. Based on the logic state of mode control 228, DNAND string can be selected to perform a NAND function or a DRAM function.

Diagram 204 includes a BL 242, DSG 230, SSG 238, NAND cells 232-236, SL 240, and a cell channel 226. Cell channel 226, in one embodiment, is used to connect NAND cells 232-236 in a series forming a string. NAND cells 232-236 are coupled to WL0-WLn for selecting which NAND cell should be accessed. In one embodiment, cell channel 226 is able to temporally store data. Based on the logic state of mode control 228, DNAND string can be selected to perform a NAND function or a DRAM function.

The DNAND device, in one embodiment, able to store information includes NVM cells 212-216, WL0-WLn, cell channel 206, and DRAM mode select 228. NVM cells 212-216 are capable of retaining information persistently. The NVM cells include at least one NAND nonvolatile memory cell. Note that NAND nonvolatile memory cell can store data during one of normal operation and emergency power loss. WL0-WLn is able to select one of the NVM cells to be accessed. Cell channel 206 interconnects NVM cells to form an NVM string. DRAM mode select 228 coupled to the NVM string is configured to allow cell channel 206 to temporarily store data when DRAM mode select 228 is active. In one aspect, WLs can be applied with a pass voltage which is higher than off-cell voltage to set up for a DRAM operation.

In one embodiment, the DNAND device includes an NVM mode select such as control 228 and able to persistently store data in one of the NVM cells when NVM mode select such as mode control 228 is active. Note that BL 208 is configured to provide bit information. In one example, the DNAND device also includes DSG 210 and SSG 220 wherein DSG 210 is able to connect BL 208 to the DNAND string. SSG 218 is used to connect to SL 220 to the DNAND string. It should be noted that DRAM mode select and NVM mode select are controlled by a single control signal such as mode control 228. The NVM cells, in one example, include at least one Silicon-Oxide-Nitride-Oxide-Silicon ("SONOS") nonvolatile memory cell.

Figures 3, 4A, 4B:
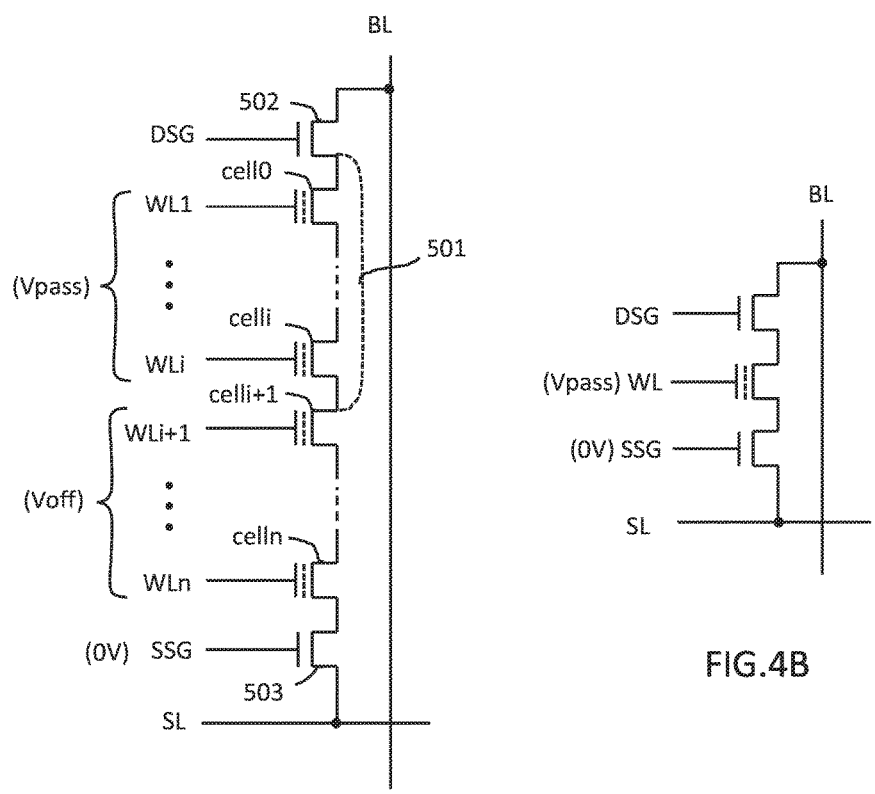
FIGS. 4A-B and 5A-B are diagrams illustrating circuit layouts of DNAND memory device in accordance with one embodiment of the present invention.

FIG. 3 illustrates a table showing DNAND memory device able to perform a NAND or DRAM function in accordance with one embodiment of the present invention. The table illustrates voltage distribution during an erase period, program period, and read period for a DNAND cell string. For example, while signals of DSG, WLunselect, SSG, BL, SL are set to floating ("FL") voltage, WL select is set to zero (0) volts and TPW (triple p-well) is set to positive high voltage ("Vpp") during the erase period. It should be noted that the underlying concept of the exemplary embodiment(s) of the present invention would not change if one or more signals (or lines) were added to or removed from FIG. 3.

The voltages shown in the table show voltage distributions for a DNAND memory device wherein the device is configured to have two operation modes, namely, NAND mode and DRAM mode. During the NAND mode, it can be erased, programmed, and read as the NAND. During the DRAM mode, the cell can be read and write as a DRAM cell. In one embodiment, the table, shown in FIG. 3, illustrates voltage distribution or bias conditions of the cells during the NAND mode. During the erase phase, the Triple P-well (TPW) in the deep N-well where the selected cells are located is applied with a positive high voltage ("VPP"), such as 20 volts ("V") for floating gate NAND or 10-15V for SONOS NAND. The application of VPP will cause electrons injected from the floating gate toward the channel region by Fowler-Nordheim tunneling mechanism to decrease the cells' threshold voltage ("Vt"). During programming phase, the selected WL is applied with VPP such as 20V. The unselected WLs are applied with a positive medium voltage ("VMP") such as 10V. VMP will boost the channel region of the cells to about 8V. For the cell is selected for programming, the BL is applied with 0V that will leak away the channel voltage. Thus, the selected cell is programmed by Fowler-Nordheim tunneling mechanism to inject electrons from the cells channel region toward the floating gate whereby the cell Vt is increased. For a program-inhibit cell phase, BL is applied with VDD that will cause the drain select gate to turn off due to the reverse bias, thus the channel region will remain high V to cancel the electric field of the selected WL whereby the program is inhibited. During a read mode, both the DSG and SSG are applied with VDD and SL is applied with 0V. BL is subsequently pre-charged to VDD. The selected WL is applied with Vread which is selected between on-cell and off-cell's Vt. The unselected WLs are applied with Vpass which is higher than the highest off-cell's Vt. If the selected cell's Vt is higher than Vread, the cell will remain off thereby the BL remains at VDD. If the selected cell's Vt is lower than Vread, the cell will be turn on and the voltage at BL will be discharged to 0V. A sense amplifier connected to BL senses BL voltage and latches the data.

In the DRAM mode, DSG, in one embodiment, is set to VDD to turn on the selected drain select gate, and 0V to turn off the unselected drain select gate. The SSG is applied with 0V to isolate the SL thus the cell's channel region can be used as capacitor to store data. VCP as indicated in the table is capacitor plate voltage, which can be any voltage such as 0V or VDD. The typically voltage is ½ VDD.

In an alternative embodiment, a memory array can be partitioned into multiple blocks with NAND portions and DRAM portions. The cells in the two portions can have different number of cells per string. For example, the cells in DRAM portion may have fewer cells per string to increase the speed, while the cells in NAND portion may have more cells to reduce the array size. In one example, for a DRAM block or portion, NAND string may contain one cell to optimize memory speed.

FIGS. 4A-B are diagrams illustrating circuit layouts of DNAND memory device in accordance with one embodiment of the present invention. FIG. 4A shows an operation condition of a cell during a DRAM mode wherein WL0-WLn are applied with a voltage of Vpass. Vpass is higher than Vt of the highest state of cells. Vpass, in operation, will turn on cells regardless of their stored data. For example, channel region 501 of a cell is used to become a capacitor for storing a charge. While SSG is applied with 0V to turn off the source select gate 503, DSG 502 is applied with a voltage to place the gate in an off position for allowing charging and/or discharging the capacitor (or cell channel) from BL. In one aspect, the entire NAND cell string acts like a DRAM cell with MOS capacitors. It should be noted that WL voltage Vpass can be constant during the DRAM mode. Note that the DRAM mode generally does not require switching process whereby it should not cause delay due to the DRAM operation.

In one embodiment, Vpass can be applied to the selected string while the unselected strings are applied with 0V or floating for minimizing gate disturbance to the cells or the data stored in the cells. During an operation, Vpass is applied to some word lines such as (WL0-WLi) and Voff is applied to other word lines such as (WLi+1-WLn) for managing size of capacitance. Since Voff is a voltage lower than the lowest Vt level of cells' data, cells 0–i will be turned on and cell i+1–n will be turned off. By applying different voltage, the DRAM cells' capacitor size can be adjusted. Alternatively, cells i+1-n can be programmed to a voltage higher than 0V applied by WL i+1-WLn to avoid negative voltage for Voff if the cell has negative Vt. It should be noted that setting DSG high can be VDD or a voltage higher than VDD+Vt (drain select transistor's threshold voltage). When a voltage higher than VDD+Vt is used, the cell's capacitor will be charged to full VDD. When VDD is used, VDD will charge the cell's capacitor to VDD-Vt.

FIG. 4B shows a bias condition for a DRAM mode that one cell per string is employed in accordance with one embodiment of the present invention. The bias condition is similar to FIG. 4A except there is no unselected WL.

Figure 5A:
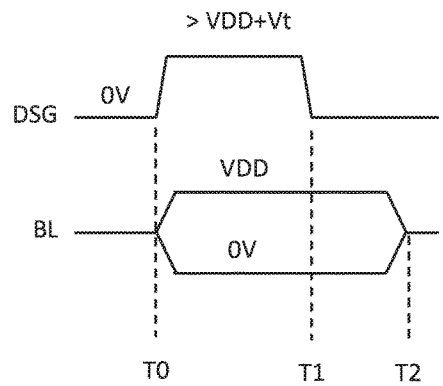
Figure 5B:
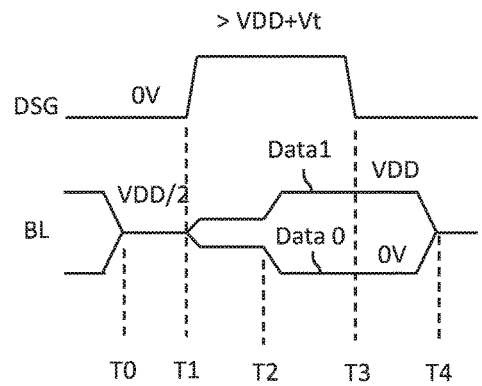

FIGS. 5A-B are waveform diagrams illustrating operations of DNAND in accordance with one embodiment of the present invention. FIG. 5A shows the cell's write waveform during the DRAM mode. At T0 time, BL is applied with VDD or 0V according to data 1 or 0, respectively. The selected DSG goes high to turn on the drain select transistor and charge the cell's capacitor to VDD or 0V by BL. At T1 time, DSG goes low. At T2 time, BL can be changed to new data for the next write cycle or pre-charged to VDD/2 for next read cycle.

FIG. 5B shows the cells' read waveform during a DRAM mode. At T0 time, BL is pre-charged to a proper voltage such as VDD/2. At T1 time, the selected DSG goes high to turn on the drain select gate which will cause the charge-sharing happen between the cell's capacitor and BL's capacitance. When the capacitor stores VDD, the capacitor will charge BL to be a little bit higher than VDD/2. When the capacitor stores 0V, the capacitor will cause BL to be a little bit lower than VDD/2. At T2 time, the sense amplifier connected to BL is activated which will develop BL swing to full VDD or VSS. Since WL remains high, BL voltage will also charge the cell's capacitor to full VDD or VSS, which is also known as "refresh" operation. Since the charge stored in the capacitor will gradually leak away via junction leakage, the cell during the DRAM mode requires periodically refreshing operation. After BL data is latched, at T4 time, BL can be pre-charged to VDD/2 again for the next read cycle.

Figure 6A:
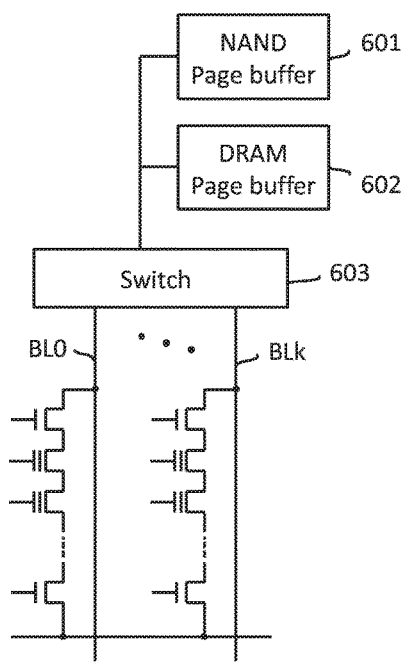
FIGS. 6A-C illustrate alternative configuration of DNAND performing DRAM and NVM functions in accordance with one embodiment of the present invention.
Figure 6B:
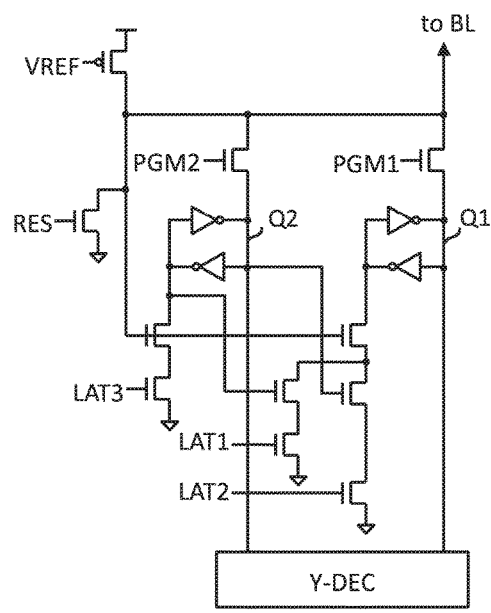
Figure 6C:
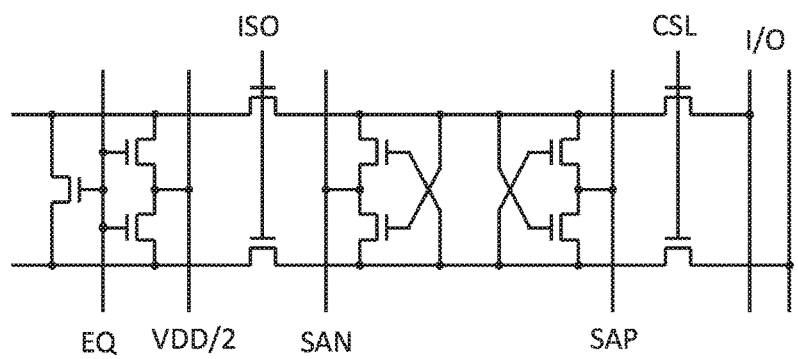

FIGS. 6A-C illustrate alternative configuration of DNAND showing DRAM and NVM in accordance with one embodiment of the present invention. Because the cell and array according to the embodiment(s) of the invention have NAND and DRAM two operation modes, the BL read and write circuit needs to be modified to perform the two operations. FIG. 6A shows a basic BL read/write circuit architecture in which BL is connected to a NAND page buffer 601 and a DRAM page buffer 602. Switch circuit 603 is used to select one BL out of multiple BL0 to BLk for reducing total number of page buffers. It also applies suitable bias condition to the unselected BL during program operations. The NAND page buffer is activated during the NAND mode and the DRAM page buffer is activated during the DRAM mode. FIGS. 6B-C show the NAND page buffer for MLC (Multiple-Level Cell) and DRAM page buffer, respectively. It should be noted that the SLC (Single-Level Cell) NAND page buffer can also be applied.

The DNAND memory device, in one embodiment, includes NAND and DRAM dual functions. To implement DNAND cell structure, multiple array configuration of DNAND can be implemented.

Figure 7A:
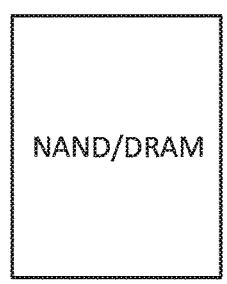
FIGS. 7A-D are block diagrams illustrate alternative physical layouts for DNAND in accordance with one embodiment of the present invention.

FIGS. 7A-D are block diagrams illustrate alternative physical layouts for DNAND in accordance with one embodiment of the present invention. FIG. 7A shows one embodiment of the present invention that the entire array is used as NAND and DRAM dual functions. While the cell in DRAM mode can perform a fast read and write operation in charge-sharing approach, the speed for the present configuration may be limited by the large capacitance of WL and BL.

Figure 7B:
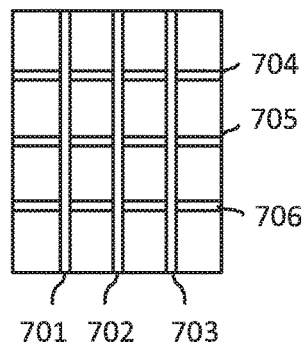

FIG. 7B shows another embodiment of the array architecture in which the entire array is used as NAND and DRAM dual functions. WL(s) and BL(s) are used to partition the array into smaller blocks whereby reducing WL and/or BL capacitance. Partitions 701-703 are WL decoders and partitions 704-706 are BL page buffers. The array can be used as fast DRAM when the DRAM mode is activated.

Figure 7C:
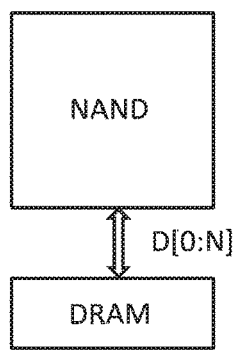

FIG. 7C shows another embodiment of the array architecture wherein the chip contains two separated arrays, NAND and DRAM. The DRAM array has a smaller WL and BL partition while the NAND array has a larger partition. It should be noted that the DRAM array can have NAND and DRAM dual functions or DRAM function only. The NAND array can have NAND and DRAM dual functions or NAND function only. The data, in one embodiment, can be transferred between the two arrays via internal bus(s).

Figure 7D:
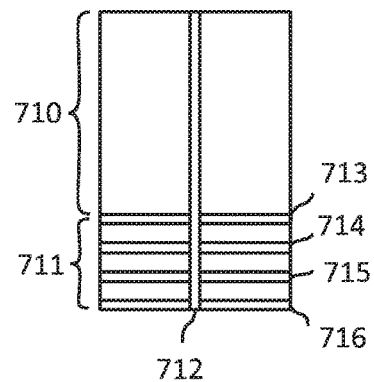

FIG. 7D shows another embodiment of the array architecture wherein the array is partitioned into NAND portion 710 and DRAM portion 711 with connected by BL(s). In one aspect, the data can be transferred between two arrays in parallel page mode whereby it greatly reduces data transfer time between two arrays. As shown, while partition 712 is the WL decoder, partitions 713-716 are the BL page buffers. Note that the cells in NAND portion and DRAM portion can have different number of the cells per string. For example, NAND portion may have 64 cells per string while DRAM portion may include 1 to 8 cells per string.

During a normal mode or NAND mode, the NAND portion's data can be read out by NAND page buffer, and transferred to DRAM page buffer, and then written to the DRAM portion. When Dram mode is activated, the DRAM portion's data can be read out by DRAM page buffer, and transferred to NAND page buffer, and then written to the NAND portion.

An advantage of using DNAND is that it allows the data be transferred between the NAND and DRAM portion without going through the external bus, thus greatly reduces the data transfer time.

In an alternative embodiment, the DRAM cell can have NVDRAM function. During the power down, the entire DRAM cells' data can be backed up to the NAND cells to prevent data lose. The DRAM mode requires an internal capacitor or an external capacitor and a backup battery to hold the VCC charge for a period of time to allow the write operation complete.

Another advantage of using DNAND is that, by using DRAM mode, allows a system to detect the data in the DRAM that is not execute for a predefined time, it can automatically program the data in DRAM cells to the NAND cells, and then stop the refresh operation to save the power consumption. When the next time the data is required, it will read the data from the NAND cells and restore the data back into the DRAM cells.

Figure 8A:
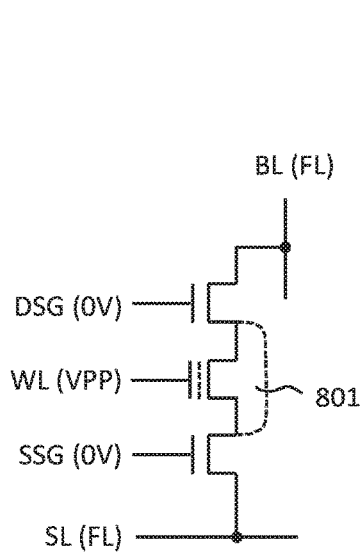
FIGS. 8A-E and 9A-C are diagrams illustrating alternative DNAND in accordance with one embodiment of the present invention.

FIGS. 8A-8E are block diagrams illustrating alternative configurations of DNAND in accordance with one embodiment of the present invention. A benefit of DNAND is able to backup data stored in the entire DRAM cells to an NAND cells in one shot. FIG. 8A shows a bias condition for programming a string with only one NAND cell. Both DSG and SSG are applied with 0V to isolate the cell's capacitor (channel region 801) from BL and SL. The DRAM cells' WL are applied with a positive high voltage VPP and the channel region of the cell may be coupled high by the WL voltage. Due to the original voltage difference between VDD and 0V, the cells initially stores 0V will have fast programmed speed than the cells initially stores VDD. As a result, after a properly selected program time, the cells storing 0V will have higher Vt than the cells storing VDD. Notice, the VPP voltage needs to be carefully selected according to the process, the program speed, and the desired Vt window.

Figure 8B:
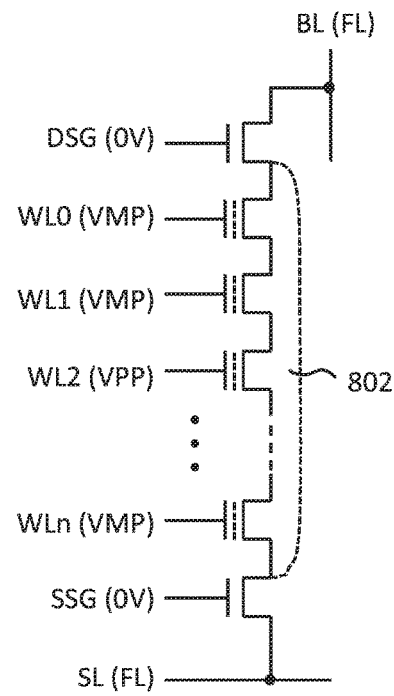

FIG. 8B shows another embodiment of the bias condition for programming a string with multiple NAND cells. The bias condition shown in FIG. 8B is similar to the bias condition shown in FIG. 8A except the unselected WL are applied with a positive medium voltage, VMP. When VMP is higher, the unselected WL will help to boost the channel region's voltage whereby it increases the inhibit effect of data one (1) cell and reduces program speed of data 0 cell. Properly selecting voltages at WLs are important based on applications, technologies, program time, and desired Vt value.

Figure 8C:
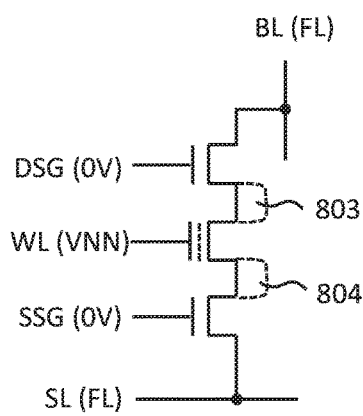

FIG. 8C shows another embodiment of the bias condition for programming a string with one NAND cell. Both DSG and SSG are applied with 0V to isolate the cell's capacitor from BL and SL. Since the selected WL is applied with a negative high voltage VNN, VNN turns off the channels of the cells whereby the cells will not couple the channel's voltage. The junction regions 803-804 remain VDD and 0V which cause electrons to tunneling from the cell's storage layer (floating gate or charge trapping layer) toward the junctions whereby reduces cells' Vt. Because of the junction voltage difference, the cells storing VDD will have fast programmed speed than the cells storing 0V. As a result, after a properly selected program time, the cells storing VDD will have lower Vt than the cells storing 0V. Note that VNN needs to be carefully selected according to the process, the program speed, and the desired Vt window.

Figure 8D:
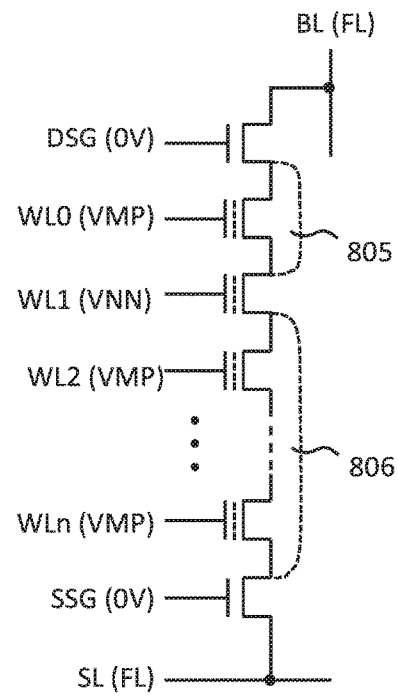

FIG. 8D shows another embodiment of the bias condition for programming a string with multiple NAND cells. The bias condition shown in FIG. 8D is similar to the bias condition shown in FIG. 8C except that unselected WLs are applied with a positive medium voltage, VMP. When VMP is high, the unselected WLs will help to boost the channel region's voltage whereby it increases program speed of data 1 cell, which, however, may reduce the inhibit effect of the data 0 cell. Properly selected voltage according to the technology, the program time, and the desired Vt value can be important for the operation of DNAND.

Figure 8E:
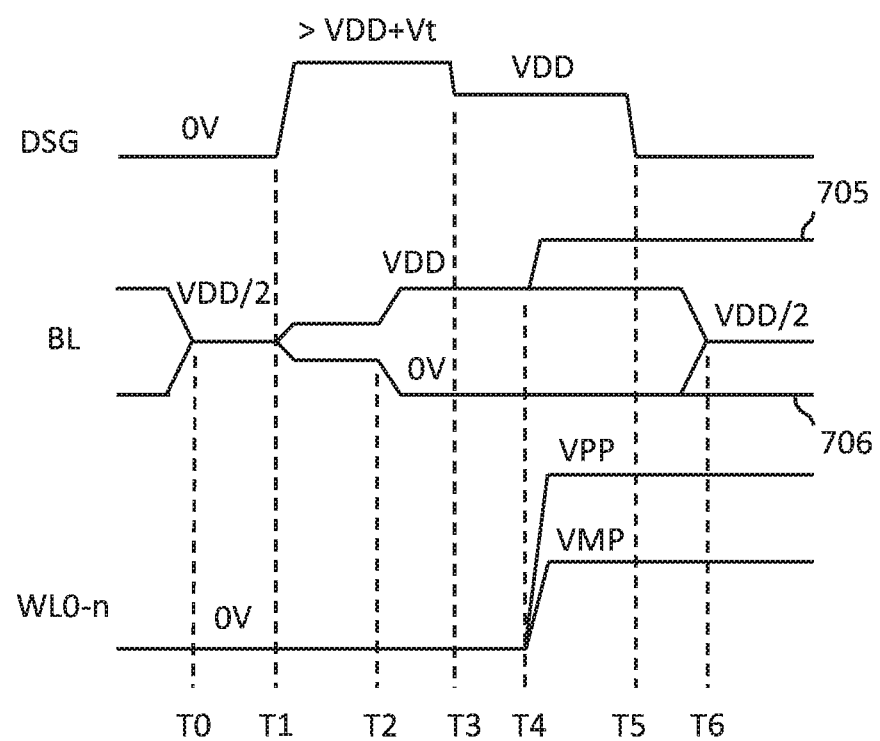

FIG. 8E shows a waveform illustrating bias conditions of FIG. 8A-B in accordance with one embodiment of the present invention. At T0 time, the BL is pre-charged to VDD/2. At T1 time, the selected DSG is applied with VDD or a voltage higher than VDD+Vt to read the DRAM cell's data which causes charge-sharing between the cell's capacitor and the BL's capacitance. At T2 time, the sense amplifier is activated to develop the BL to full VDD or VSS. At T3 time, DSG is lowered to VDD or a voltage lower than VDD if it is applied with VDD+Vt. At T4 time, the selected WL is applied with VPP and the unselected WLs are applied with VMP which will couple the channel region of the data 1 cell to a higher voltage as shown in numeral 705. The voltage will not leak away via BL because DSG is off due to the reverse bias from BL's VDD. In contrast, for data 0 cell, its channel region will be discharged to 0V by the 0V on its BL as shown in numeral 706. Compared with the previous embodiment, this embodiment has higher channel voltage difference thus have larger margin between the data 1 and 0 cells Vt. At T5 time, DSG goes low. At T6 time, BL is pre-charged to VDD/2 again. The process from T0 to T7 can be repeated for the next DSG. The operation keeps repeating until all the DRAM cells are set. Note that although this embodiment requires setup the WL voltage for all the DRAM cells page by page, it actually does not take long time. Because it takes less than 50 ns to set up one page, it may only take 50 us to setup the entire DRAM assuming it has 1K pages. After all the pages are set, the entire DRAM cells are programming simultaneously, thus save the total programming time, compared with the page by page programming mode.

It should be noted that DNAND operation as illustrated can be implemented in NAND process, logic process, DRAM process, SRAM process, or any other processes.

Although the examples in FIG. 8A-8E show the NMOS stacked-gate NAND array, it is for example only. For example, the cell can be PMOS cell or split-gate. The storage layer can be charge trapping layer such as ONO (Oxide-Nitride-Oxide), ONONO, SONOS, BESONOS, floating gate, or any other material that can store the electric charge. The cells can use SLC (one bit per cell), MLC (two bits per cell), or TLC (three bits per cell), etc. The array structure can be 2D (two-dimension) or 3D (three-dimension). The cell strings can also contain or not contain source and drain junction. WL can also use traditional formation or double-pattern formation.

Figure 9A:
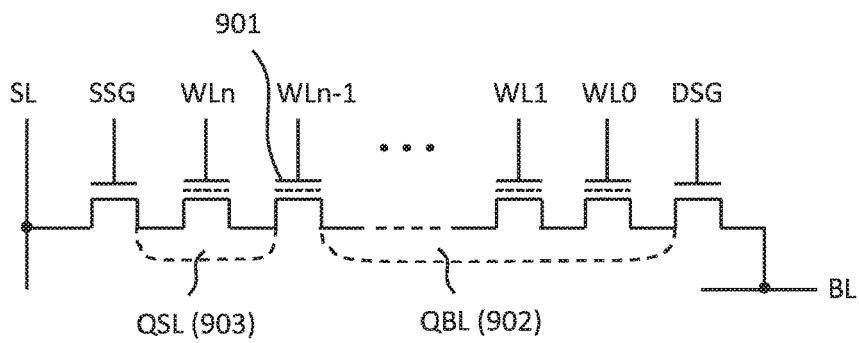
Figure 9B:
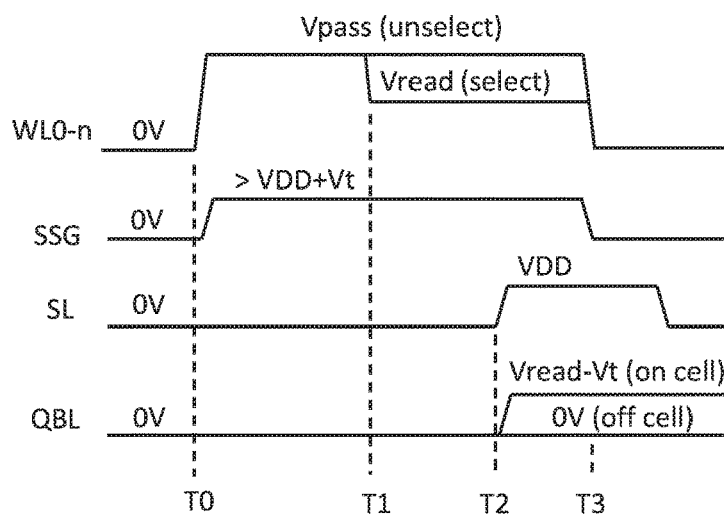
Figure 9C:
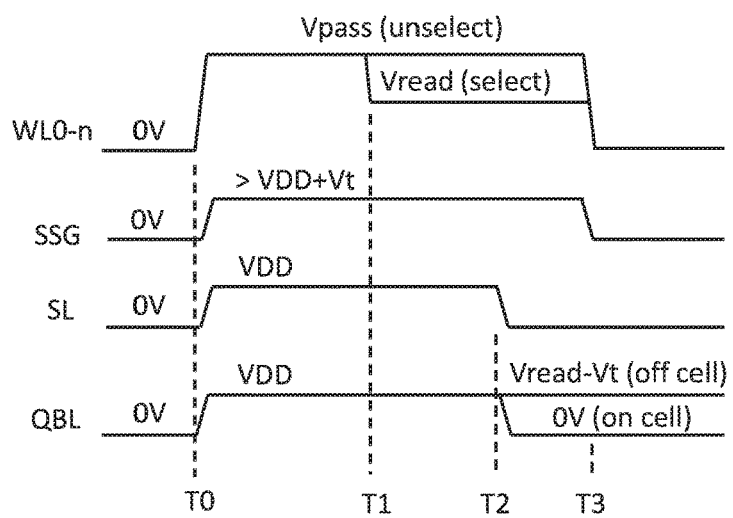

FIGS. 9A-C illustrate a process of transferring data from selected NAND cells to DRAM cells such as channel regions in accordance with one embodiment of the present invention. A function of DAND is able to transfer data between NAND and DRAM internally. FIG. 9A shows that cell 901 is selected. To simplify forgoing discussion, the channel region of the cells in the selected cell's BL side is called "QBL" 902, and the channel region of the cells in its SL side is called as "QSL" 903. The data transfer can be done from applying voltage from SL or BL. The waveform, shown in FIG. 9B, illustrates an embodiment of applying voltage from SL. At T0 time, all WL0-$n$ are applied with a voltage higher than the highest Vt of the cells. SSG is applied with a voltage higher than VDD+Vt and SL is applied with 0V which turns on all of the cells regardless their Vt and subsequently discharges their channel region, QBL 902 and QSL 903 to 0V. At T1 time, the selected WL is lowered to a voltage Vread that is between the Vt (on-cell) and Vt (off-cell) of the desire cell's Vt. At T2 time, SL is pulled to VDD. If the selected cell is an on-cell, it will pass the SL voltage to QBL and charge it to Vread-Vt (on-cell). If the selected cell is off, it will not pass the SL voltage thus QBL will remain at 0V. In one aspect, the Vread is selected to be higher than Vt (on-cell)+VDD whereby it can fully pass VDD to QBL. In one embodiment, SL can be applied with a voltage higher than VDD and SSG can be applied with a voltage higher than SL+Vt to fully pass the voltage. It should be noted that more charge may be stored in the QBL region. After the data is stored in QBL, SSG, at T3 time, goes to 0V to isolate the SL.

There are several ways to handle the WL voltages after T3 time. In one embodiment, after T3 time, the selected WL is pulled high to Vpass to turn on the selected cell's channel region again which may cause charge sharing between QBL and QSL. While it is possible to reduce the stored voltage to VDD/2, a refresh operation can be introduced after the transfer operation. During the refresh operation, BL's pre-charge voltage needs to be adjusted from VDD/2 to a lower voltage such as VDD/4 for example, according to this condition.

According to another embodiment of the invention, after T3 time, all WL can be pulled to a voltage higher than Vpass which will boost QBL to a higher voltage to increase the charge stored in QBL. After T3 time, the unselected WL in the SL side of the select cell are pulled low to 0V to turn off their channel whereby the charge will be stored in QBL region. Note that charge sharing may not occur between QBL and QSL whereby the original charge VDD is kept in QBL. During the first refresh operation, while BL is charging the cell's channel region to VDD, all the unselected WL on the SL side of the cell, however, can be pulled high to Vpass to turn on the QSL region to maximize the storage capacitor of the cell.

In another embodiment, after T3 time, the unselected WL in the SL side of the selected cell are pulled low to 0V and the unselected WL in the BL side are pulled to a voltage higher than Vpass. This will keep the charge in QBL region only and boost it to a higher voltage.

Please notice, according to the invention, in another embodiment, the DRAM cell can be also read by pre-charging from the BL and discharged from SL. Also in another embodiment, the DRAM cell can be read by pre-charging from the SL and discharge from BL. FIG. 9C shows a waveform which is similar to the waveform shown in FIG. 9B except that SL is initially applied with 0V at T0 time and pulled up to VDD at T2 time. The QBL region will be charged to Vpass-Vtcell at T0 time, and at T2 time, depending on the selected cell is turned on or off, QBL is discharged to 0V or remain QBL at Vpass-Vtcell. In one embodiment, Vpass is selected to be higher than VDD+Vtcell, thus it will pass full VDD to QBL. Note that Vread is a voltage that is higher than Vt(on-cell) because it is used to turn on the on-cell to discharge the QBL to 0V.

Figures 10A, 10B:
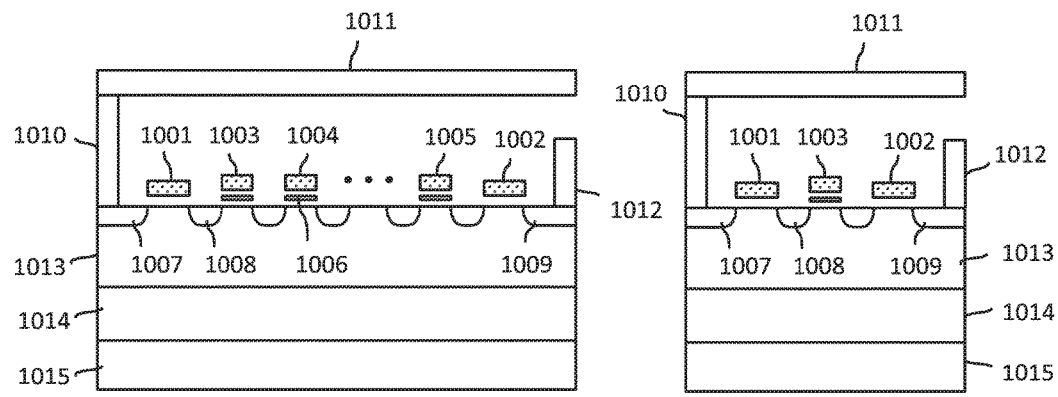
FIGS. 10A-B and 11-15 are diagrams illustrating operation as well as configuration of DNAND in accordance with one embodiment of the present invention.

FIGS. 10A-B are physical configurations of DNAND illustrating logical process in accordance with one embodiment of the present invention. The DNAND cell and array architecture of DNAND can be implemented in any process including logic process which can be desirable to include both DRAM and NAND memories in a single chip. FIGS. 10A-B show exemplary implements of DNAND by using a logic process. FIG. 10A shows an NAND string that contains a drain select gate 1001, source select gate 1002, multiple cells 1003-1005. Note that charge trapping layer 1006 may be an ONO or ONONO layer 1007-1009 which are diffusion regions. BL contact 1010 is coupled to BL 1011 while SL is contact 1012. In one embodiment, the cells can be implemented by either NMOS or PMOS. Note that the cells may be located directly on substrate, or inside a well 1013 inside a deep well 1014 on substrate 1015. FIG. 10B shows another example of DNAND in which it contains one cell 1003 in a string. In one aspect, additional three (3) masks are added to a standard logic process to fabricate a DNAND device. The masks for ONO etch, reverse ONO-etch after the poly-gate is formed, and a mask for deep N-well to locate the cells for negative voltage circuit can be used.

Figures 11, 12:
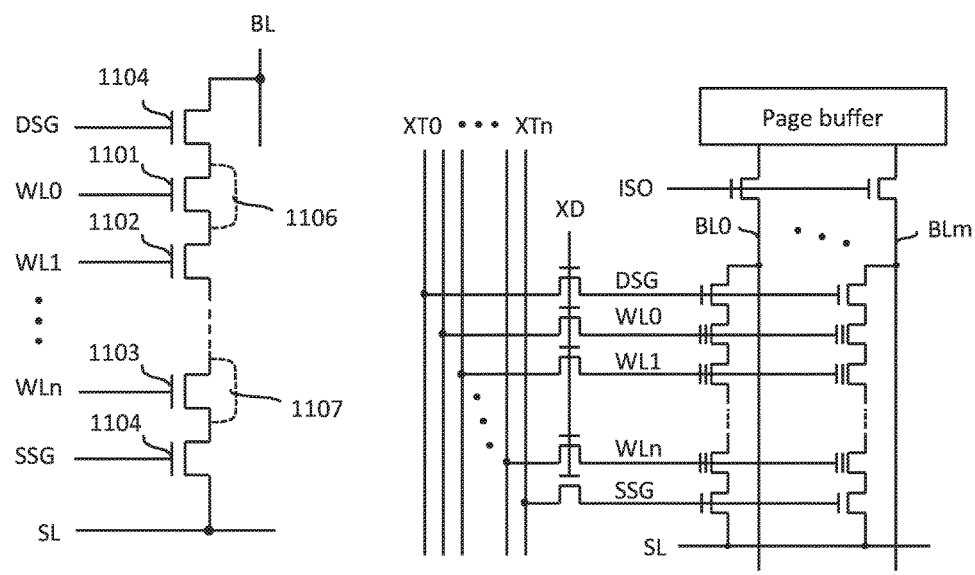

FIG. 11 is a block diagrams illustrating a physical configuration of DNAND in accordance with one embodiment of the present invention. In one embodiment, the array architecture can be applied to NAND-type of mask ROM, called D-ROM (DRAM-ROM) by the invention, wherein the array and operation are similar to DNAND shown in FIG. 8D except the cell is Mask ROM cell instead of flash memory cell. FIG. 11 shows the array architecture of a NAND string that contains DSG 1104, SSG 1105, and multiple ROM cells 1101-1103. The ROM cells' gates are connected to WL0-WLn. The ROM cells can be programmed by using a ROM-code mask during manufacturing to apply channel Vt implant 1106-1107 to the cells. During read operation, the proper WL voltage is applied to the selected cell to check if the cell has high or low Vt. The unselected WLs are applied with a higher voltage to turn them on regardless of their Vt. The advantage of using the NAND array ROM is it is logic process compatible. Pleas notice, the D-ROM and logic process-compatible D-NAND only has 3 masks difference. Thus it provides customers a flexible solution to use the logic-compatible D-NAND design in the development stage of the embedded products. Once the product's program code is confirmed, the whole or partial of the D-NAND array can be converted to D-ROM by replacing the ONO layer with ROM-code implant layer. Because of the D-NAND and D-ROM have the same array structures except the ONO and ROM-code layers, this makes the memory relatively low risk. Compared with the conventional arts, their embedded Flash and mask ROM's technologies are incompatible. Therefore, when convert from flash memory to mask ROM, it normally requires re-design the product.

According to one embodiment of the invention, all the data in the DRAM cells can be written to the NAND cells simultaneously at one shot. This can significantly reduce the write time, and particularly useful for emergency data backup in case of power loss. This function is similar to the traditional art of NVRAM. However, the traditional NVRAM requires a large external capacitor to hold the VCC charge when the power is loss, and use the capacitor to provide the charge for the charge pump circuit for the write operation. If the capacitor's size is not large enough, it may not hold enough charge for completing the write operation, thus the operation may fail.

The embodiment of the invention discloses a DNAND device able to perform the write operation without using the external capacitor. In one example, a small internal capacitor is needed to pump the WL voltages. Once the voltage is pumped up to the desire d value, the pump can be stopped. The control signals XD can go to 0V which will cause the WL0-WLn's voltages trapped by the WL's capacitance, as shown in FIG. 12. Since the WL capacitance for high density NAND memory is large, it will take ten to hundred miniseconds to leak away the voltages, which is enough to program the cells. Similarly, after the BL voltages are set, the signal ISO can go to 0V which causes the BLs' voltages and the cell strings' voltages, as well as the NAND cells' channel self-boosted inhibit voltages be hold by the local capacitance, too. Even the chips VCC drops to 0V, the voltage trapped in this capacitance will continue the write operation until the voltages are leaked away by the junction leakage. In this way, the external large capacitor can be eliminated.

Figure 13:
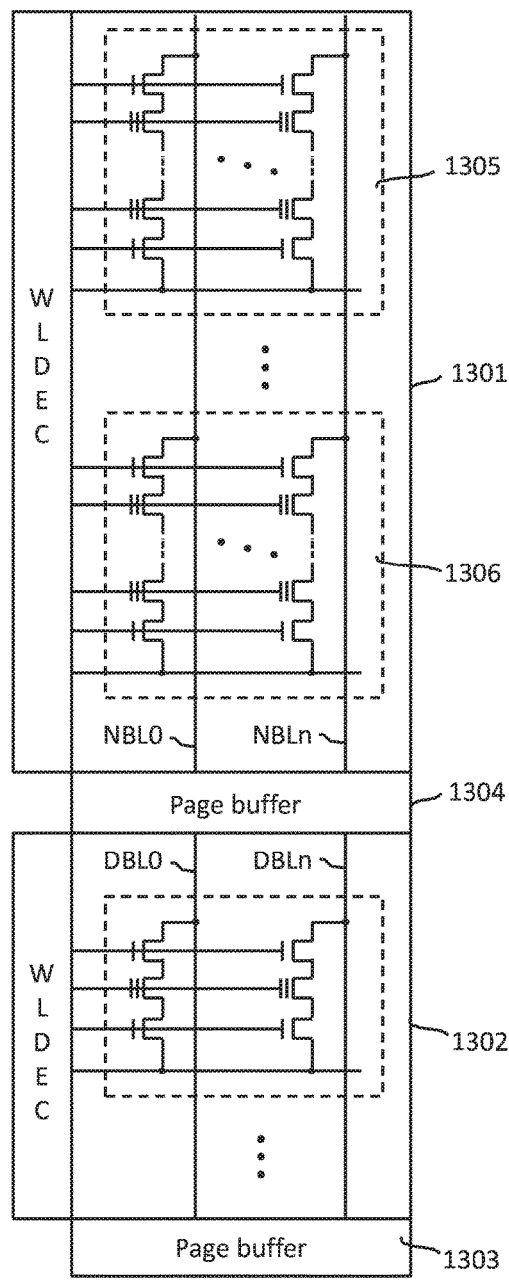

FIG. 13 shows one embodiment of array architecture wherein the array may be divided into at least two portions 1301-1302. Portion 1301 has longer cell strings and longer BL and portion 1301 is mainly for NAND storage purpose. Portion 1302 has shorter cell string and shorter BL wherein portion 1302 is mainly for DRAM purpose. The DRAM portion may contain one or more page buffers 1303 to read and write the cells in DRAM portion. The NAND portion may contain one or more page buffers 1304 to read and write the cells in NAND portion. In one aspect, the DRAM potion and the NAND portion may have the same number of BL. Both DRAM and NAND portions BL, NBL0-NBLn and DBL0-DBLn, are connected to the NAND portion's page buffers 1304. This allows the data of the DRAM portion been transferred to the page buffers 1304 in parallel through all BLs and written to the NAND portion.

An advantage of using DNAND device is to minimize slow transition time between the DRAM and NAND using external data bus.

During the write time, because the write data has been saved in the page buffers 1304, the DRAM portion can be still accessed for read and write operations by the page buffers 1303. Please notice, according to the invention, the write operation of the NAND portion can be applied to multiple strings, such as shown in dash-lines 1305-1306 simultaneously, by loading the data into each string.

Another advantage of using DNAND is that it saves write time by writing multiple pages of data to the NAND portion at one time. For example, the array architecture allows the NAND portion's data be read to the page buffer 1304 and then transferred to the DRAM portion parallel through all BLs at the same time which can significantly reduce the transfer time of the traditional arts that transfers through the external data bus. The page buffers' location in the figure is for example only. They can be also located in any proper locations such as on top of the array, etc. Alternatively, the two page buffers can be located together.

Figure 14:
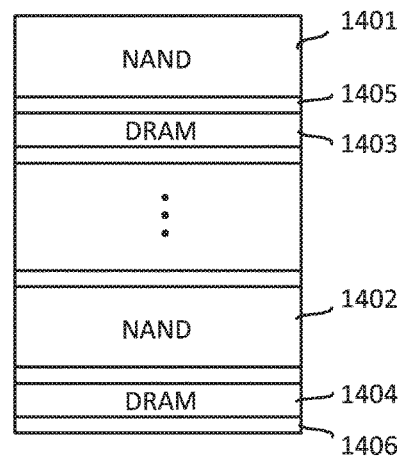

FIG. 14 shows another embodiment of the array architecture according to the invention. This array contains multiple NAND portions 1401-1402 and multiple DRAM portions 1403-1404 wherein blocks 1405-1406 are page buffers. This embodiment allows multiple DRAM portions perform the write operation to their associated NAND portions while other DRAM portions can still be random accessed. Notice, according to the invention, the NAND portion and all the DRAM portions can transfer data in parallel through all the BLs to save the data transfer time.

Figure 15:
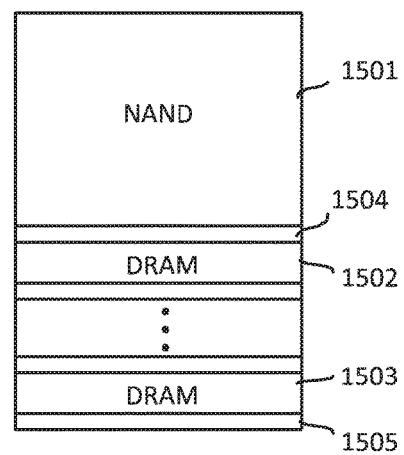

FIG. 15 shows another embodiment of the array architecture according to the invention. This array contains one big NAND portions 1501 and multiple DRAM portions 1502-1503 wherein blocks 1504-1505 are page buffers. DNAND allows some DRAM portions perform the write operation to the NAND cells associated to the DRAM cells while other DRAM portions can still be random accessed. Notice, according to the invention, the NAND portion and all the DRAM portions can transfer data in parallel through all the BLs to save the data transfer time.

Figure 16A:
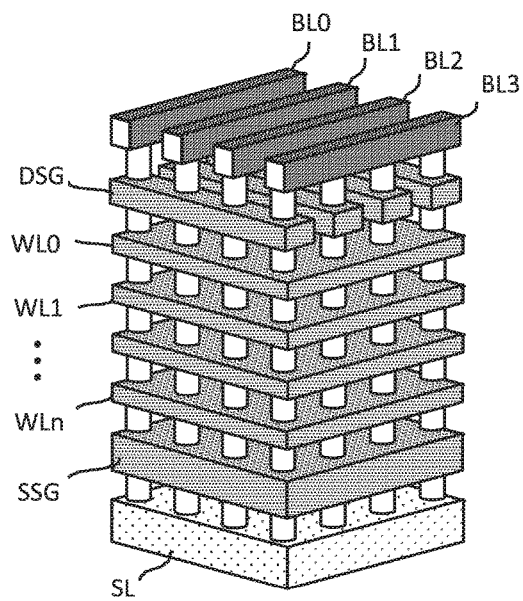
Figure 16B:
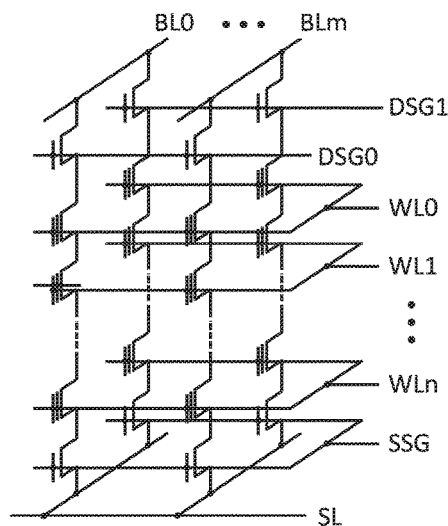
Figure 17A:
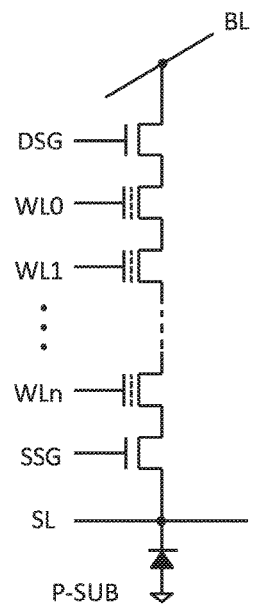
Figure 17B:
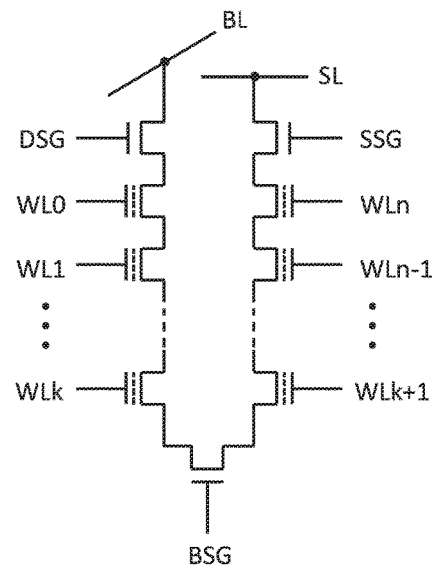

FIGS. 16A-B and 17A-D are diagrams illustrate two-dimensional ("2D") or three-dimensional ("3D") DNAND in accordance with one embodiment of the present invention. FIGS. 16A-B shows some examples that DNAND can be structured based on a 3D semiconductor configuration. FIG. 16A shows a 3D NAND array architecture and FIG. 16B shows the circuit of the array. FIGS. 17A-C show alternative 3D NAND array architectures using the similar blocks. FIG. 17D shows another example of multiple stacked 3D NAND array structure that the present embodiment can be applied to. It should be noted that the underlying concept of the exemplary embodiment(s) of the present invention would not change if one or more blocks (or devices) were added to or removed from FIGS. 16A-B and 17A-D.

FIGS. 18A-B and 19A-C are diagrams illustrating exemplary DNAND configurations with multiple NAND strings in accordance with one embodiment of the present invention. FIGS. 18A-B show NAND string(s) with vertical-SL structure rather than the conventional horizontal-SL structure used for performing dual functions. The dual function includes DRAM function and NVM functions. The NAND strings can be used to form an array. When using the DRAM mode, WL in the center such as WL 1801, WL 1802, or WL 1803, for example, can be applied with a low voltage to turn off the cell. Once the cell is off, it causes the NAND string become two DRAM cells wherein one can be selected from BL while another can be selected from SL. Alternatively, separated DSGs and/or SSGs can be used to improve accessibility of NAND strings.

Figure 19A:
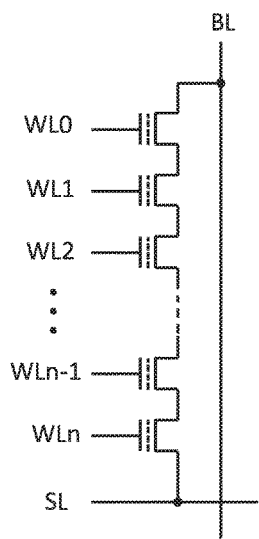
Figure 19B:
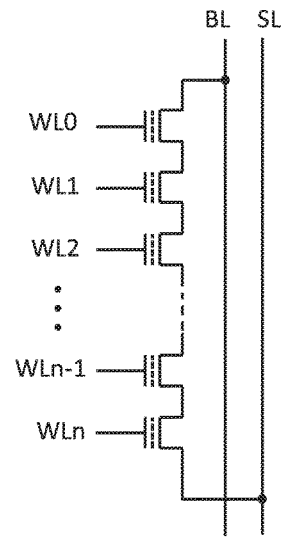
Figure 19C:
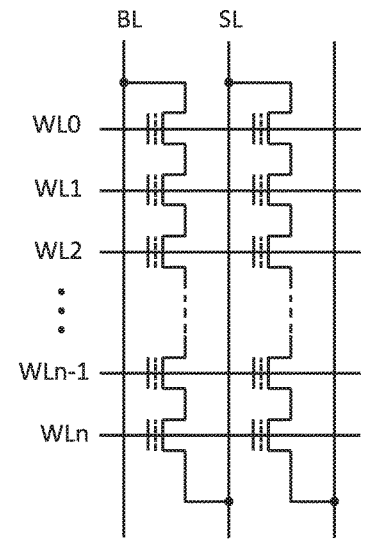

FIGS. 19A-C illustrate exemplary embodiments of DNAND array that is capable of providing dual functions. In one aspect, the NAND string used in DNAND is similar to the conventional NAND string except there is no DSG and SSG. Depending on the applications, the NAND strings can be selected to perform DRAM function or NVM function.

The exemplary aspect of the present invention includes various processing steps, which will be described below. The steps of the aspect may be embodied in machine or computer executable instructions. The instructions can be used to direct a general purpose or special purpose system, which is programmed with the instructions, to perform the steps of the exemplary aspect of the present invention. Alternatively, the steps of the exemplary aspect of the present invention may be performed by specific hardware components that contain hard-wired logic for performing the steps, or by any combination of programmed computer components and custom hardware components.

Figure 20:
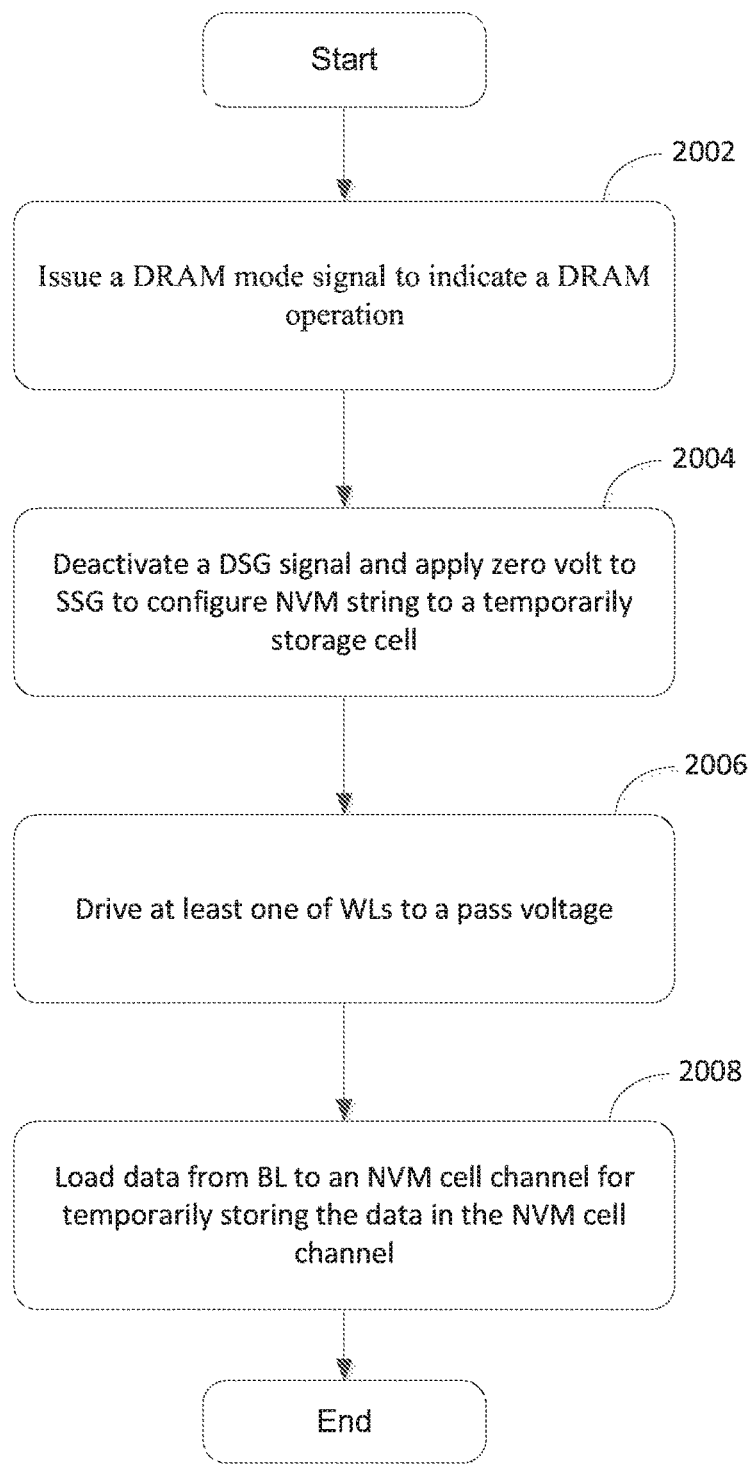
FIG. 20 is a flow chart illustrating a DNAND operation able to temporarily store data in an NVM string in accordance with one embodiment of the present invention.

FIG. 20 is a flow chart 2000 illustrating a DNAND operation able to temporarily store data in an NVM string in accordance with one embodiment of the present invention. At block 2002, a process capable of storing information in a memory array issues a DRAM mode signal to indicate a DRAM operation. In one aspect, the memory array is configured to provide a dual function which can perform either an NVM function or a DRAM function based on the mode selections.

At block 2004, a DSG signal is deactivated at DSG to disconnect BL from an NVM string and applying a voltage of zero volt to SSG which facilitate and/or configure the NVM string into a temporarily storage cell or a DRAM cell.

At block 2006, at least one of WLs connected to NVM cells of the NVM string is driven to a pass voltage which is higher than a voltage of highest state of NVM cells.

At block 2008, data is loaded from BL to an NVM cell channel for temporarily storing the data in the NVM cell channel. In one embodiment, the process is able to issue an NVM mode signal to indicate an NVM operation. Note that the DSG signal can be activated at DSG to connect BL to the NVM string to configure the NVM string to a nonvolatile storage and subsequently the data is loaded or transferred from BL to one of the NVM cells in the NVM string to persistently store the data in the NVM cell. Note that a mode select line can be set as an active state to indicate the DRAM operation while the mode select line is reset as an inactive state to indicate the NVM operation. After driving a portion of the WLs connected to the NVM cells to a voltage of zero volts, the data, for example, is forwarded from the NVM cell channel to a DRAM page buffer via a switch during a read operation.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A memory device operable to store information, comprising:
   a nonvolatile memory ("NVM") array having a plurality of first NVM strings organized in multiple rows and multiple columns, the columns of the NVM array configured to couple to a plurality of NVM bit lines ("BLs") operable to access BL data of a NVM page;
   a dynamic random-access memory ("DRAM") array having a plurality of second NVM strings organized in multiple rows and multiple columns, the columns of the DRAM array configured to couple to at least a portion of the columns of the NVM array operable to provide access between the DRAM array and the NVM array; wherein at least a portion of data is stored and read from a cell channel at vicinity of one of the plurality of second NVM strings; and
   a mode selection circuit coupled to the DRAM array and configured to control access between the DRAM array and the NVM array.

2. The device of claim 1, further comprising a page buffer couple to the DRAM array via a switch circuit.

3. The device of claim 1, wherein the NVM array and the DRAM array are fabricated on same die.

4. The device of claim 3, wherein the DRAM array has substantially same pitch as the NVM array in a semiconductor layout.

5. The device of claim 1, wherein the DRAM array is one of NAND flash memory array, NOR flash memory array, phase-changing memory array, Electrically Erasable Programmable Read-Only Memory ("EEPROM") array, and Silicon-Oxide-Nitride-Oxide-Silicon ("SONOS") nonvolatile memory array.

6. The device of claim 2, wherein the DRAM array, the NVM array, and the switch circuit are fabricated on a single semiconductor die.

7. The device of claim 1, wherein the NVM array includes a plurality of first nonvolatile memory ("NVM") cells capable of retaining information persistently.

8. The device of claim 7, wherein the NVM array includes a plurality of first word lines ("WLs") and configured to select one of the plurality of first NVM cells to be accessed.

9. The device of claim 8, wherein each of the plurality of the first NVM strings includes a cell channel configured to interconnect a plurality of NVM cells.

10. The device of claim 1, further comprising a first NVM mode select coupled to the NVM array and configured to persistently store data in one of the plurality of NVM cells.

11. The device of claim 1, further comprising a first bit line ("BL") coupled to the NVM array and configured to provide bit information.

12. The device of claim 11, further comprising:
    a first drain select gate ("DSG") coupled to the NVM array and configured to connect to the BL; and
    a source select gate ("SSG") coupled to the NVM array and configured to connect to a source line ("SL").

13. The device of claim 1, wherein at least a portion of the NVM array is configured to store data during one of normal operation and emergency power loss.

14. The device of claim 1, wherein each of the plurality of first NVM strings contains multiple NVM cells interconnected in a series via a cell channel.

15. The device of claim 1, wherein the plurality of first NVM strings includes at least one Silicon-Oxide-Nitride-Oxide-Silicon ("SONOS") nonvolatile memory cell.

16. A memory device operable to store information, comprising:
    a nonvolatile memory ("NVM") array having a plurality of first NVM strings organized in multiple rows and multiple columns, the columns of the NVM array configured to couple to a plurality of NVM bit lines ("BLs") operable to access BL data of a NVM page;
    a dynamic random-access memory ("DRAM") array having a second NVM string and configured to temporarily store data using one or more cell channels as storage regions when a DRAM mode select is active, wherein the data is stored and read from the cell channels while word lines are driven with a pass voltage; and a mode selection circuit coupled to the DRAM array and configured to control access between the DRAM array and the NVM array.

17. The device of claim 16, further comprising a page buffer couple to the DRAM array via a switch circuit.

18. The device of claim 16, wherein the NVM array and the DRAM array are fabricated on same die.

19. The device of claim 16, wherein the DRAM array has substantially same pitch as the NVM array in a semiconductor layout.

20. The device of claim 16, wherein the DRAM array is one of NAND flash memory array, NOR flash memory array, phase-changing memory array, Electrically Erasable Programmable Read-Only Memory ("EEPROM") array, and Silicon-Oxide-Nitride-Oxide-Silicon ("SONOS") nonvolatile memory array.

* * * * *